(12) United States Patent
Lee et al.

(10) Patent No.: US 7,709,751 B2
(45) Date of Patent: May 4, 2010

(54) METHOD FOR MAKING FILM ASSEMBLY USED IN PDP FILTER, FILM ASSEMBLY MANUFACTURED BY THE METHOD, AND PDP FILTER WITH THE FILM ASSEMBLY

(75) Inventors: Dong-Wook Lee, Daejeon (KR); In Seok Hwang, Daejeon (KR); Yeon Keun Lee, Daejeon (KR); Sang Hyun Park, Daejeon (KR); Jung Doo Kim, Daejeon (KR); Hyun Seok Choi, Daejeon (KR); Su Rim Lee, DaeJeon (KR)

(73) Assignee: LG Chem, Ltd., Seoul (KR)

( * ) Notice: Subject to any disclaimer, the term of this patent is extended or adjusted under 35 U.S.C. 154(b) by 991 days.

(21) Appl. No.: 11/007,576

(22) Filed: Dec. 9, 2004

(65) Prior Publication Data

US 2005/0162056 A1    Jul. 28, 2005

(30) Foreign Application Priority Data

Dec. 10, 2003  (KR)  .................. 10-2003-0089390
Oct. 28, 2004  (KR)  .................. 10-2004-0086444

(51) Int. Cl.
*H05K 9/00*    (2006.01)

(52) U.S. Cl. .................. 174/389; 174/392; 313/313
(58) Field of Classification Search .................. 174/389, 174/390, 392; 313/479, 313
See application file for complete search history.

(56) References Cited

U.S. PATENT DOCUMENTS

2003/0094296 A1   5/2003   Kojima et al.
2003/0156080 A1*  8/2003   Koike et al. .................. 345/60
2003/0176124 A1*  9/2003   Koike et al. .................. 442/16
2005/0039936 A1*  2/2005   Hikita et al. .............. 174/35 R

FOREIGN PATENT DOCUMENTS

| CN | 1397057 (A) | 2/2003 |
| EP | 1 069 088 | 1/2001 |
| EP | 1 267 318 | 12/2002 |
| EP | 1 283 106 | 2/2003 |

(Continued)

OTHER PUBLICATIONS

International Search Report dated Mar. 14, 2005.

*Primary Examiner*—Hung V Ngo
(74) *Attorney, Agent, or Firm*—McKenna Long & Aldridge LLP

(57) ABSTRACT

Disclosed is a method for making a film assembly used in a PDP filter positioned on the front surface of a PDP, a film assembly manufactured by the method, and a PDP filter using the film assembly. The method includes providing a roll of an EMI film formed on a surface of a long transparent polymer resin film with a predetermined spacing and mounting the wound roll of the EMI film on a first feed roller; providing a roll of at least one long transparent functional film capable of covering at least partially the effective screen portions of the EMI film and mounting the wound roll of the functional film on a second feed roller which is spaced a predetermined distance from the first feed roller; and integrating the EMI film with the functional film by feeding them into a gap between the first and second compression rollers.

10 Claims, 18 Drawing Sheets

FOREIGN PATENT DOCUMENTS

| | | |
|---|---|---|
| JP | 2000-059084 | 2/2000 |
| JP | 2002-123182 | 4/2002 |
| JP | 2002-251144 | 9/2002 |
| JP | 2002-323860 | 11/2002 |
| WO | WO 01-57833 | 8/2001 |
| WO | WO 02/074532 | 9/2002 |

* cited by examiner

EMI FILM

FILM ASSEMBLY

METHOD FOR MAKING FILM ASSEMBLY USED IN PDP FILTER, FILM ASSEMBLY MANUFACTURED BY THE METHOD, AND PDP FILTER WITH THE FILM ASSEMBLY

CROSS-REFERENCE TO RELATED APPLICATIONS

This application claims the benefit of Korean Patent Application Nos. 10-2003-89390 and 2004-86444, filed Dec. 10, 2003 and Oct. 28, 2004 respectively in Korea, which are hereby incorporated by reference in their entirety.

TECHNICAL FIELD

The present invention relates to a method for making a film assembly for a plasma display panel (hereinafter, referred to as PDP) filter positioned on the front surface of a PDP, a film assembly manufactured by the method, and a PDP filter with the film assembly, and more particularly to a method for manufacturing a film assembly for a PDP filter capable of largely manufacturing a film assembly including an EMI film having a conductive effective screen portion formed on a transparent polymer resin film and a functional film attached to the effective screen portion of the EMI film in a roll-to-roll mode, a film assembly manufactured by the method, and a PDP filter with the film assembly.

BACKGROUND ART

In general, a PDP is an image display device that uses plasma created by gas discharge to display images. It can be manufactured in a flat shape with reduced weight, it can display image on a large screen, and it has excellent viewing angle. Therefore, it is spotlighted as the next-generation image display device.

A PDP filter as shown in FIG. 1 includes a reinforced or semi-reinforced glass 1 having a predetermined size and a film assembly 2 attached to one surface or to the other surface of the glass to generate various effects advantageous to a PDP TV.

The film assembly 2 is made up of at least two films chosen from a group including an EMI (electromagnetic interference) film 3 for shielding electromagnetic waves, an NIR (near infrared) film 4 for preventing near infrared waves from being generated to enable smooth remote control, a color compensation film 5 for compensating for the color of light, and an AR (anti-reflection) film 6 for reducing the surface reflection of external light.

As shown in FIGS. 2 and 3, the EMI film 3 includes a transparent polymer resin film 3a and an effective screen portion 3b having a conductive material formed on the polymer resin film 3a by an etching or deposition process to shield electromagnetic waves.

The conductive material constituting the effective screen portion 3b is opaque metal or metal oxide and is formed in a mesh pattern or a dispersed particle pattern to secure the transparency of the effective screen portion 3b. Respective functional films 4, 5, and 6 laminated on the effective screen portion 3b of the EMI film 3 play the role of preventing the screen from being unclear due to the uneven surface of the effective screen portion 3b, in addition to their own basic function.

Four edges of the EMI film 3 are exposed to the exterior to shield electromagnetic waves generated from the PDP and act as a ground portion 3aa that is grounded to the corresponding surface of the PDP.

However, the functional films attached to the effective screen portion of the EMI film must have a size smaller than that of the EMI film so that the ground portion of the EMI film can be sufficiently grounded to the corresponding surface of the PDP. As a result, the film assembly partially constituting the PDP filter cannot be manufactured in large amounts.

In addition, the functional films which are smaller than the EMI film must be aligned with and attached to the effective screen portion of the EMI film one by one every time a film assembly is manufactured. This process is very inefficient and degrades the productivity.

DISCLOSURE OF THE INVENTION

Therefore, the present invention has been made in view of the above-mentioned problems, and it is an object of the present invention to provide a method for manufacturing a film assembly for a PDP filter capable of largely manufacturing a film assembly including an EMI film having an effective screen portion formed on a transparent polymer resin film and at least one functional film attached to the effective screen portion of the EMI film in a roll-to-roll mode (continuous batch production mode).

It is another object of the present invention to provide a film assembly for a PDP filter having a sufficient ground region between the ground portion of an EMI film partially constituting the film assembly and the corresponding surface of a PDP.

It is still another object of the present invention to provide a PDP filter using a film assembly having a sufficient ground region.

According to an aspect of the present invention, there is provided a method for making a film assembly for a PDP filter including the steps of providing a roll of an EMI film having a number of conductive effective screen portions formed on a surface of a long transparent polymer resin film with a predetermined spacing and mounting the wound roll of the EMI film on a first feed roller; providing a roll of at least one long transparent functional film capable of covering at least partially the effective screen portions of the EMI film and mounting the wound roll of the functional film on a second feed roller which is spaced a predetermined distance from the first feed roller; and positioning first and second compression rollers with a predetermined distance from the first and second feed rollers while facing each other closely and feeding the EMI film from the first feed roller and the functional film from the second feed roller into a gap between the first and second compression rollers so that the EMI film and the functional film are integrated with each other and form a film assembly.

According to another aspect of the present invention, there is provided a film assembly for a PDP filter including an EMI film having a conductive effective screen portion formed on a surface of a transparent polymer resin film; at least one functional film attached to face the conductive effective film and having the same length as the EMI film and a width to at least partially cover the conductive effective screen portion on the EMI film; and conductive members positioned on both short edges of the left and right sides of the function film, respectively, to secure a ground region for the EMI film.

According to another aspect of the present invention, there is provided a method for making a film assembly for a PDP filter including the steps of punching a functional film to form a number of through-holes on at least two edges thereof along its length with a predetermined unit in such a manner that the through-holes correspond to ground portions on edges of an EMI film having a conductive effective screen portion formed thereon; joining the functional film having the through-holes formed thereon and the EMI film having the effective screen portion formed thereon to each other in a continuous process (roll-to-roll mode) to successively bond at least two film layers; and forming a conductive material around the through-holes of the functional film and on the corresponding portions of the ground portions of the EMI film to electrically connect the ground portions of the EMI film of the film layers to at least a part of the outer edges of the functional film via the through-holes.

According to another aspect of the present invention, there is provided a film assembly for a PDP filter including an EMI film having a conductive effective screen portion formed on a surface thereof and a functional film attached to face the effective screen portion of the EMI film and having at least partially an electrical connection means for electrical connection between ground portions formed on edges of the EMI film and the corresponding surface of a PDP during assembly.

According to another aspect of the present invention, there is provided a PDP filter having a film assembly, as mentioned above, attached to at least one of both surfaces of a transparent substrate.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Embodiments of the present invention will now be described in detail with reference to FIGS. 4 to 18f.

Figure 1:
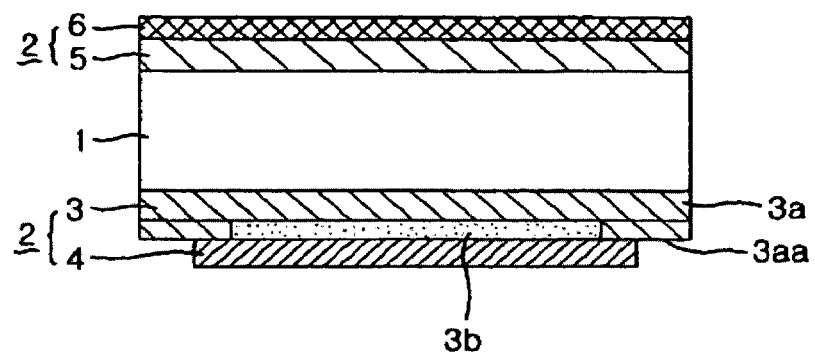
FIG. 1 is a sectional view showing briefly a conventional PDP filter.
Figure 2:
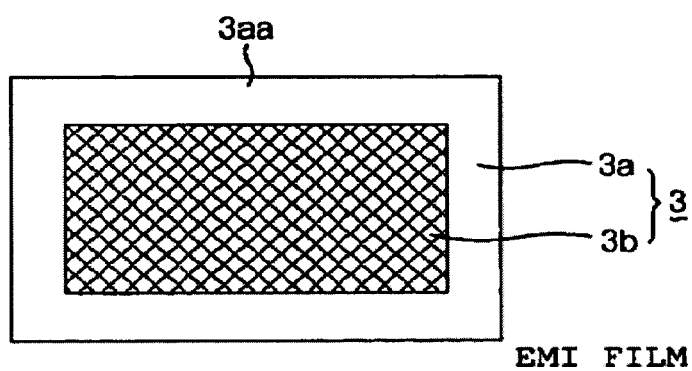
FIG. 2 is a front view showing briefly an EMI film having an effective screen portion formed on a transparent polymer resin film used in a film assembly for a PDP filter according to the prior art.
Figure 3:
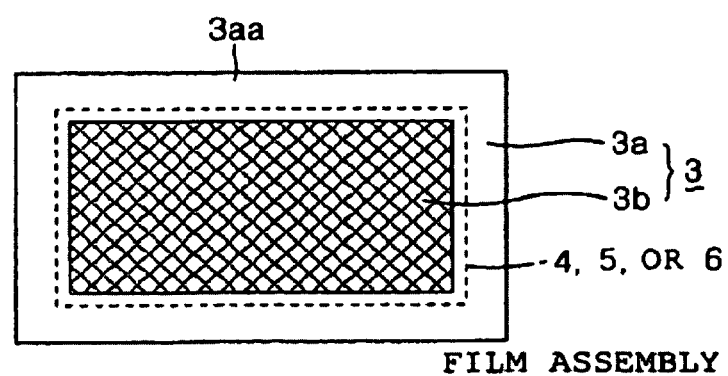
FIG. 3 shows an EMI film having an effective screen portion and a functional film attached thereto with a size slightly larger than that of the effective screen portion.
Figure 4:
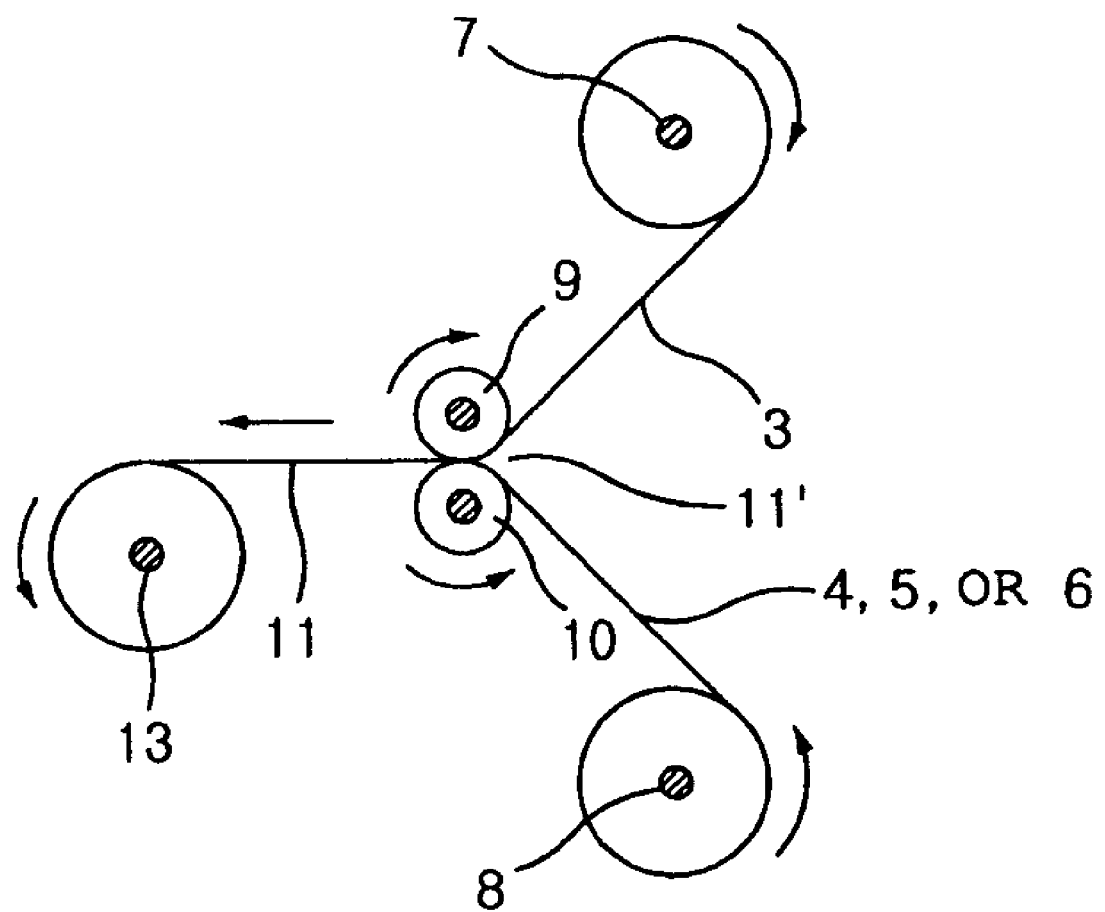
FIG. 4 shows the arrangement of roller apparatuses used to manufacture a film assembly for a PDP filter according to the present invention.
Figure 5:
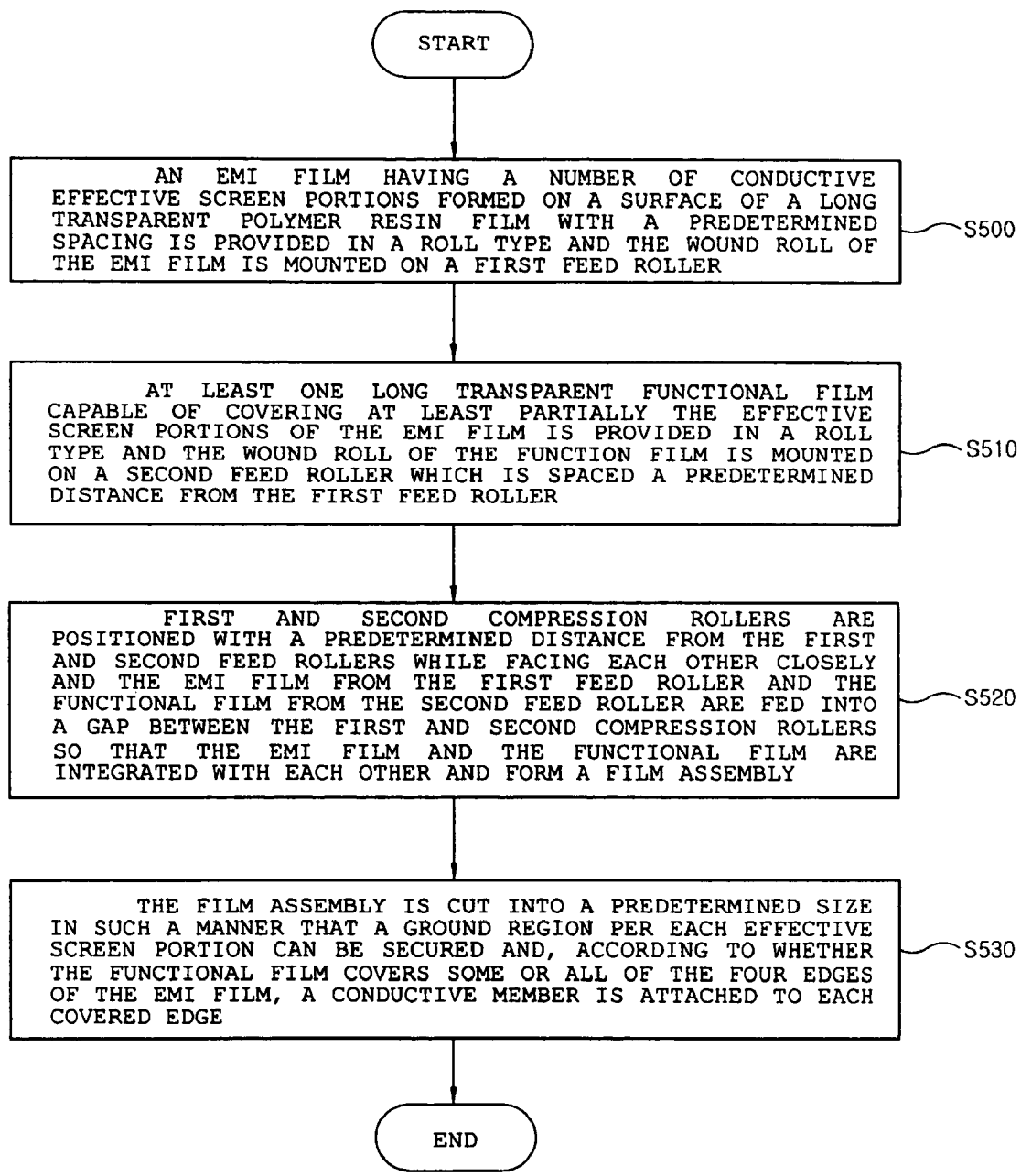
FIG. 5 is a flowchart showing a method for manufacturing a film assembly for a PDP filter according to a first embodiment of the present invention.
Figure 6:
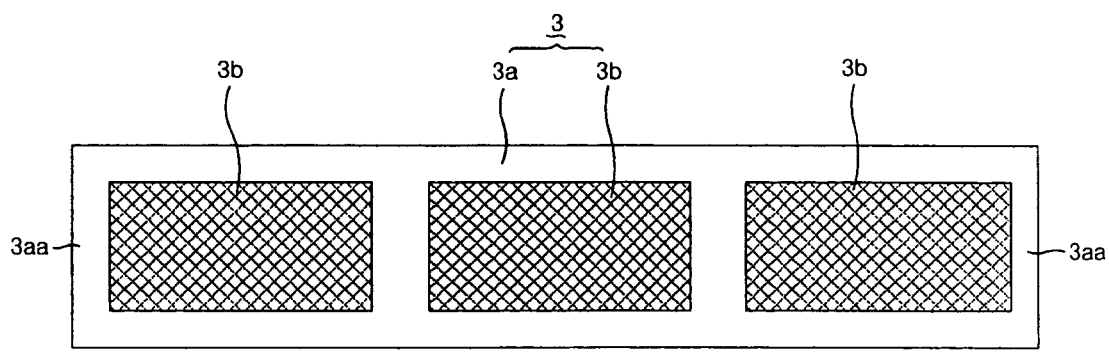
FIG. 6 is a front view showing briefly an EMI film having a number of effective screen portions formed on a long transparent polymer resin film with a predetermined spacing for use in a method for manufacturing a film assembly for a PDP filter according to the present invention.
Figure 7:
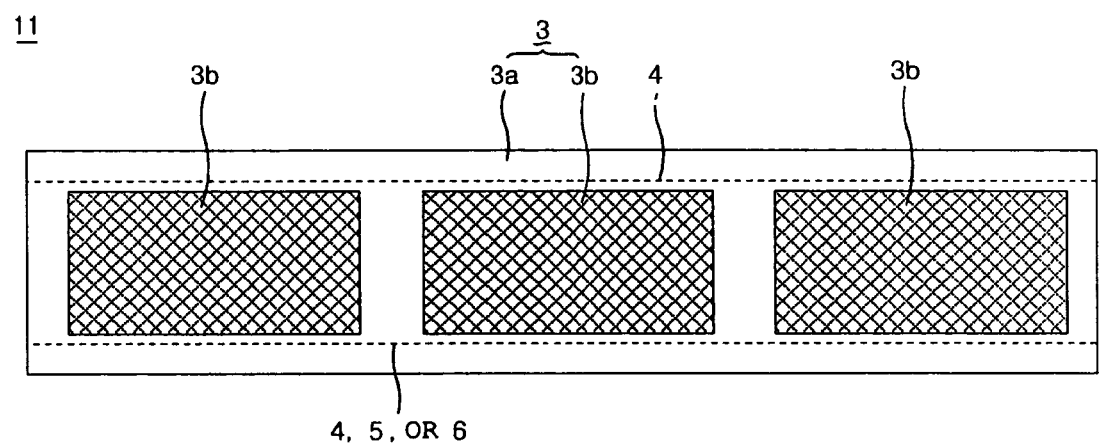
FIG. 7 shows a long EMI film having a number of effective screen portions and a functional film attached to the EMI film along the length of the EMI film with a size larger than the width of the effective screen portions but smaller than the width of the EMI film.

FIG. 4 shows the arrangement of roller apparatuses used to manufacture a film assembly for a PDP filter according to the present invention and FIG. 5 is a flowchart showing a method for manufacturing a film assembly for a PDP filter according to a first embodiment of the present invention.

A method for manufacturing a film assembly for a PDP filter according to a first embodiment of the present invention will now be described with reference to FIGS. 5 to 9.

An EMI film 3 having a number of conductive effective screen portions 3b formed on a surface of a long transparent polymer resin film 3a with a predetermined spacing is provided in a roll type. The wound roll of the EMI film is then mounted on a first feed roller 7 (step 500).

Next, at least one long transparent functional film 4, 5, and 6 capable of covering at least partially the effective screen portions 3b of the EMI film 3 is provided in a roll type. The wound roll of the functional film is then mounted on a second feed roller 8 which is spaced a predetermined distance from the first feed roller 7 (step 510).

Next, first and second compression rollers 9 and 10 are positioned with a predetermined distance from the first and second feed rollers 7 and 8 while facing each other closely. The EMI film 3 from the first feed roller 7 and the functional film 4, 5, or 6 from the second feed roller 8 are then fed into a gap between the first and second compression rollers 9 and 10 so that the EMI film 3 and the functional film 4, 5, or 6 are integrated with each other and form a film assembly 11 (step 520; refer to FIGS. 4 to 7).

Next, the film assembly 11 is cut into a predetermined size in such a manner that a maximum ground region per each effective screen portion 3b can be secured. According to whether the functional film 4, 5, or 6 covers some or all of the four edges of the EMI film 3, a conductive member 12 is attached to each covered edge (step 530; refer to FIGS. 8 and 9).

The method for making a film assembly according to the present invention may further include a step (not shown) of winding the film assembly 11, which is drawn through the first and second compression rollers 9 and 10, into a roll on a winding roller 13 which is spaced a predetermined distance from the first and second compression rollers 9 and 10. When wound into a roll, the film assembly 11 can be produced, stored, and transported more conveniently.

The first and second feed rollers 7 and 8 and the first and second compression rollers 9 and 10 are connected to at least one power source (not shown), such as a motor, the revolution and speed of which are controlled by a control unit (not shown).

The EMI film 3 and the functional film 4, 5, or 6 may be bonded to each other by heat supplied from the exterior through the first and second compression rollers 9 and 10 or may be integrated with each other by a compression force from the first and second compression rollers 9 and 10.

When the EMI film 3 and the functional film 4, 5, or 6 are bonded to each other by heating at least one of the first and second compression rollers 9 and 10, the corresponding surface of the functional film (at least one of 4, 5, and 6) is previously coated with a hot-melt resin. The EMI film 3 and the functional film 4, 5, or 6 are then integrated with each other, as the hot-melt resin melts due to heat supplied from at least one of the first and second compression rollers 9 and 10.

The hot-melt resin is preferably made up of an EVA (ethylene vinyl acetate) resin. At least one of the first and second compression rollers 9 and 10 is preferably maintained at a temperature of 100-200° C. Any polymer resin may be used for the hot-melt resin, as long as it can maintain stable bond between the EMI film 3 and the functional film 4, 5, or 6.

When the EMI film 3 and the functional film 4, 5, or 6 are bonded to each other by applying pressure through the first and second compression rollers 9 and 10, a pressure-sensitive adhesive is previously applied to the corresponding surface of the functional film 4, 5, or 6.

The EMI film 3 and the functional film 4, 5, or 6 are then integrated with each other via the pressure-sensitive adhesive, as pressure is applied by the first and second compression rollers 9 and 10.

The integration process causes the EMI film 3 and the functional film 4, 5, or 6 to be integrated with each other in a very reliable manner. If the EMI film 3 and the functional film 4, 5, or 6 are to be bonded to each other more closely, the film assembly 11 of the EMI film and the functional film 4, 5, or 6 may be wound into a roll and placed in an autoclave (not shown) to stay therein for a period of time at a predetermined temperature and pressure. This process makes bonding state of the EMI film 3 and the functional film 4, 5, or 6 more closely.

The temperature in the autoclave is 10-100° C., preferably 20-80° C., more preferably 30-60° C. and the pressure is 0.2-2 MPa, preferably 0.3-0.8 MPa. The time of stay of the EMI film and the functional film is 2-60 minutes, preferably 5-20 minutes.

The functional film 4, 5, or 6 mounted on the second feed roller 8 in a roll type may be fed into a gap between the first and second compression rollers 9 and 10 as a single kind of film corresponding to the EMI film 3 fed from the first feed roller 7 or as a couple of types of films previously integrated with each other. The effective screen portions 3b of the EMI film 3 may be formed by an etching process, a deposition process, or any other process.

A film assembly according to the present invention manufactured by the above-mentioned method will now be described with reference to FIGS. 8 and 9.

Figure 8:
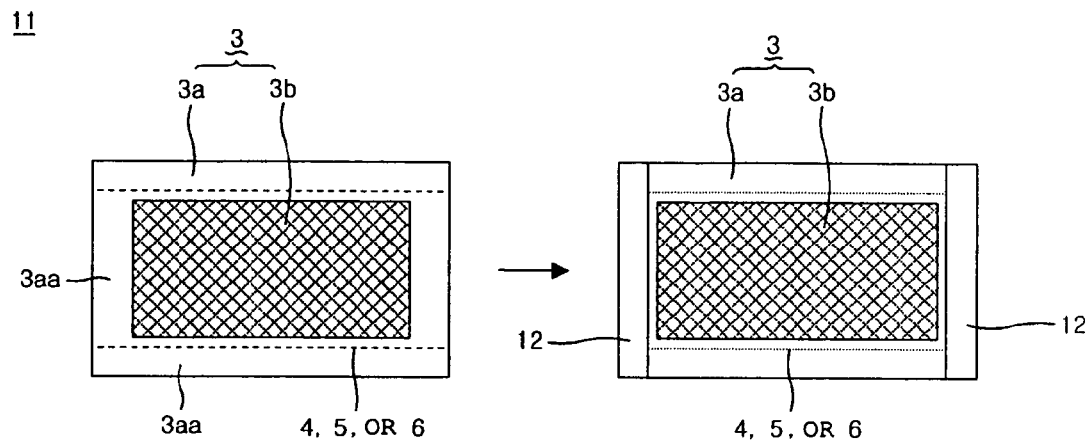
FIG. 8 shows a view of film assembly which includes a long EMI film and a corresponding functional film and which has been cut into a basic unit and a view of the cut film assembly having conductive members positioned on both lateral edges thereof.

A film assembly 11 according to the present invention as shown in FIG. 8 includes an EMI film 3 having a conductive effective screen portion 3b formed on a surface of a transparent polymer resin film 3a;

at least one functional film 4, 5, or 6 which is attached to face the conductive effective screen portion 3b and which has the same length as the EMI film and a width to at least partially cover the conductive effective screen portion 3b on the EMI film 3; and conductive members 12 positioned on both short edges of the left and right sides of the function film, respectively, to secure a ground region for the EMI film 3.

Figure 9:
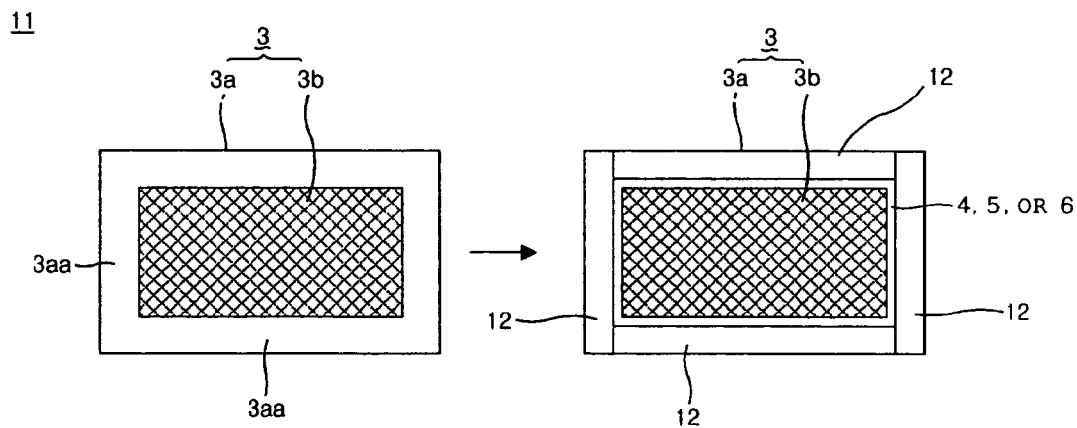
FIG. 9 shows a view of a film assembly according to another embodiment of the present invention which includes a long EMI film having a number of effective screen portions formed on a long transparent polymer resin film and a functional film attached to the EMI film with the same size as the EMI film and which has been cut into a basic unit and a view of the cut film assembly having conductive members positioned on four edges thereof.

Preferably, conductive members 12 are additionally positioned on both long edges of the EMI film 3, respectively, in order to secure a ground region for the EMI film when the functional film 4, 5, or 6 covers at least a half of both long edges of the EMI film 3 (refer to FIG. 9).

The effective screen portion 3b of the EMI film 3 is made up of at least one component chosen from a group including gold, silver, copper, nickel, and aluminum and has a mesh pattern or a dispersed particle pattern to secure the transparency of the screen.

The conductive members 12 may be any one of conductive tapes and conductive paste. The conductive paste is preferably made up of any one chosen from a group including gold, silver, copper, and graphite.

The functional film may be chosen from a group including an NIR (near infrared) film 4, a color compensation film 5, and an AR (antil-reflection) film 6.

The film assembly 11 having the functional film 4, 5, or 6 attached to the EMI film 3 may then be attached to a corresponding transparent substrate (not shown) in a convenient manner to constitute a PDP filter. The transparent substrate may be made up of reinforced or semi-reinforced glass or any other resin.

A method for making a film assembly for a PDP filter according to another embodiment of the present invention will now be described with reference to FIGS. 10 to 17d.

Figure 10:
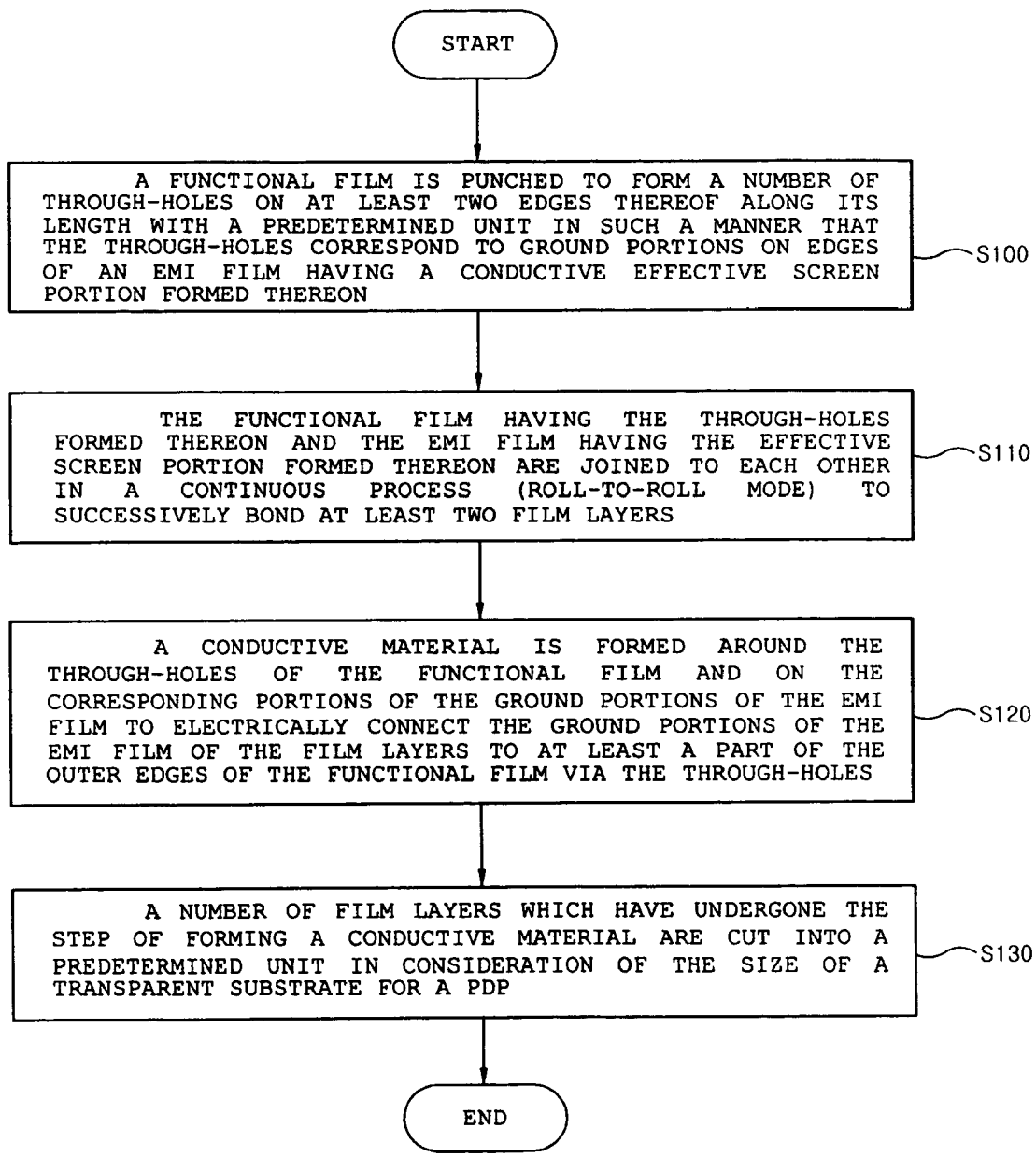
FIG. 10 is a flowchart showing a method for manufacturing a PDP filter according to a second embodiment of the present invention.

In the method for making a film assembly for a PDP filter according to the present invention as shown in FIG. 10, a functional film 4, 5, or 6 is punched to form a number of through-holes 14 on at least two edges thereof along its length with a predetermined unit in such a manner that the through-holes correspond to ground portions (or conductive layers) 3aa on edges of an EMI film 3 having a conductive effective screen portion 3b formed thereon (step 100).

Next, the functional film 4, 5, or 6 having the through-holes 14 formed thereon and the EMI film 3 having the effective screen portion 3b formed thereon are joined to each other in a continuous process (roll-to-roll mode) to successively bond at least two film layers 11' (step 110).

Next, a conductive material is formed around the through-holes 14 of the functional film 4, 5, or 6 and on the corresponding portions of the ground portions 3aa of the EMI film 3 to electrically connect the ground portions i3aa of the EMI film 3 of the film layers 11' to at least a part of the outer edges of the functional film 4, 5, or 6 via the through-holes 14 (step 120).

Next, a number of film layers 11' which have undergone the conductive material formation step are cut into a predetermined unit in consideration of the size of a transparent substrate 15 for a PDP (step 130).

Figure 16A:
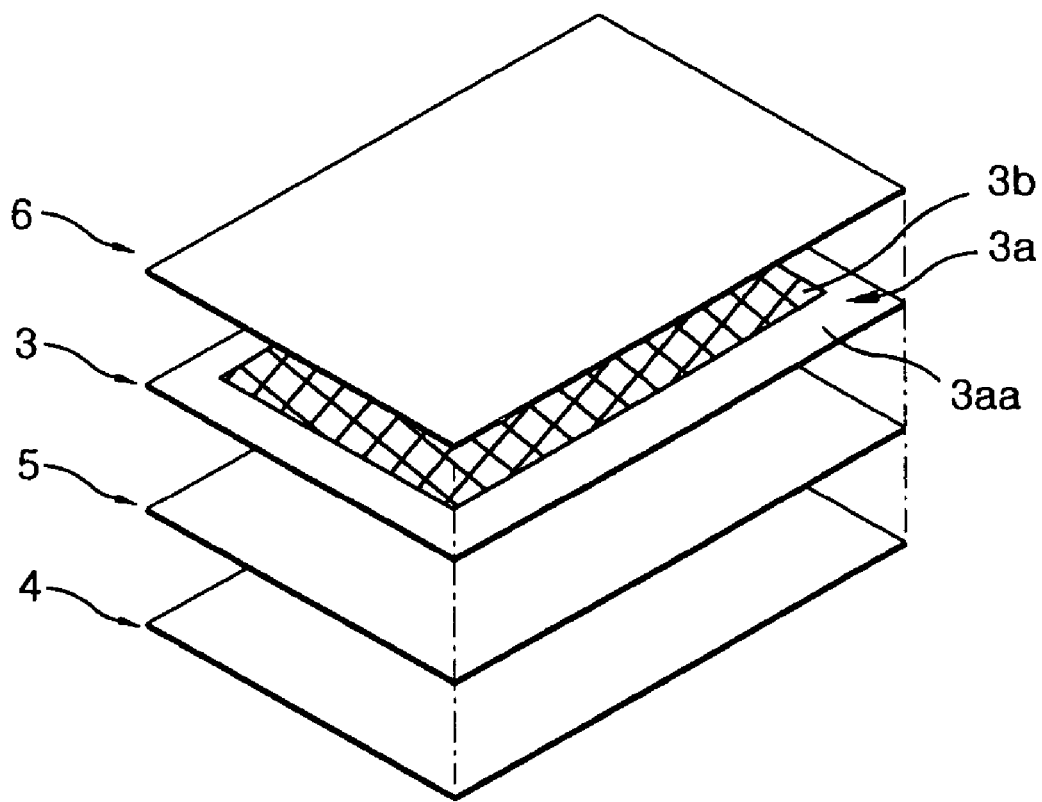
FIG. 16a is an exploded perspective view showing briefly an EMI film and a function film, which are positioned with the same size, of a film assembly according to a first embodiment of the present invention.
Figure 16B:
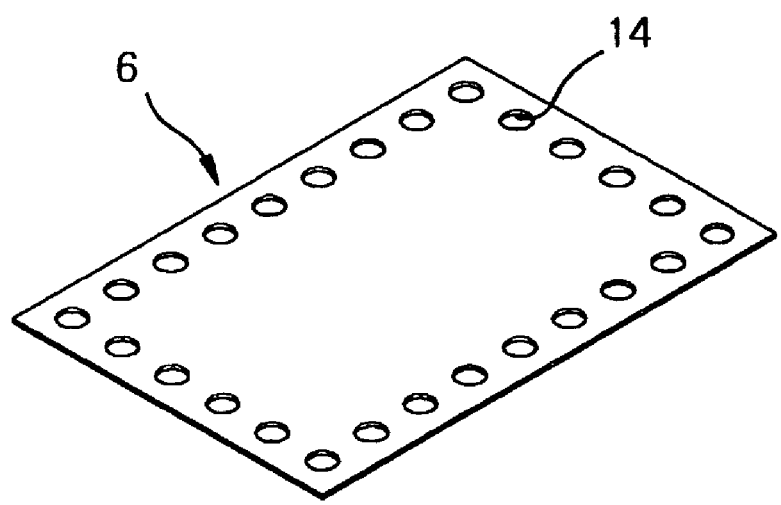
FIG. 16b is a perspective view showing briefly a functional film having through-holes formed along four edges thereof.
Figure 16C:
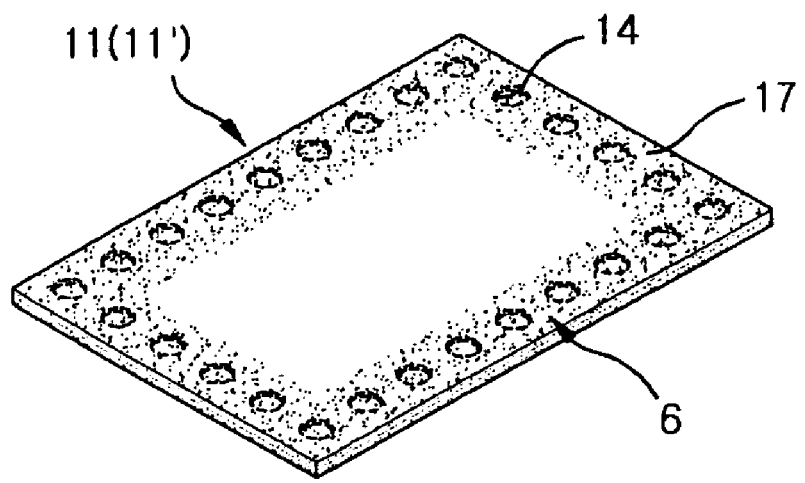
FIG. 16c is a perspective view showing briefly a film assembly including a functional film having through-holes formed thereon, a residual film integrated with the functional film, and a conductive layer formed on the corresponding portion of the films.
Figure 16D:
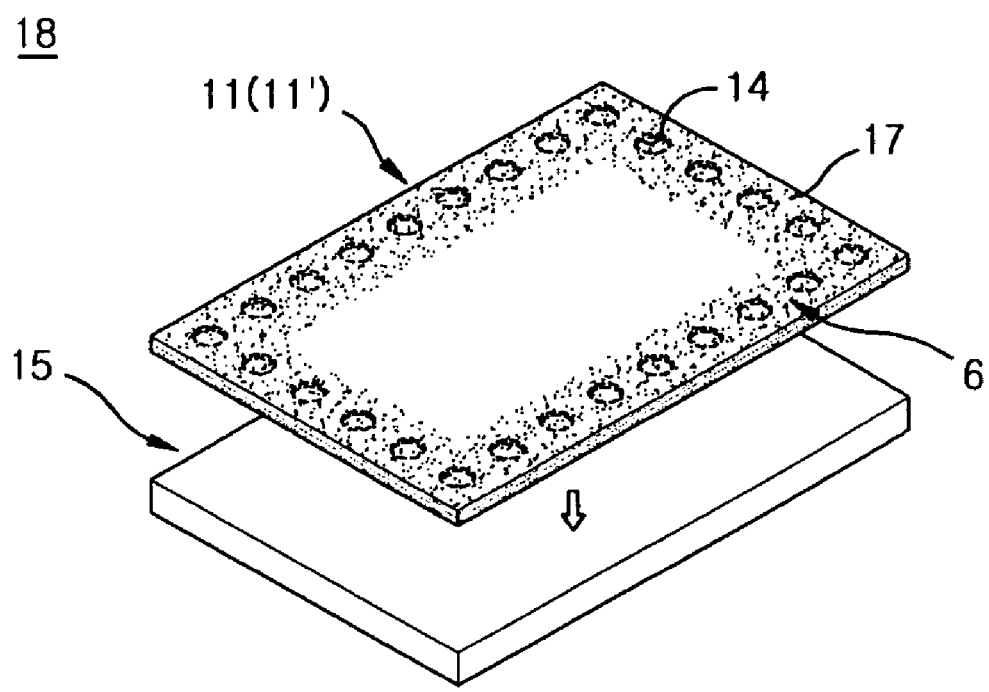
FIG. 16d is a perspective view showing briefly a film assembly, which is attached to a transparent substrate for a PDP filter, according to a first embodiment of the present invention.

If the functional film 4, 5, or 6 attached to the effective screen portion 3b of the EMI film 3 is cut into a square having the same size with the EMI film 3, in the punching step (step 100), the through-holes 4 are preferably formed on all of the four edges of the functional film 4, 5, or 6 (refer to FIGS. 16a and 16b).

Figure 17A:
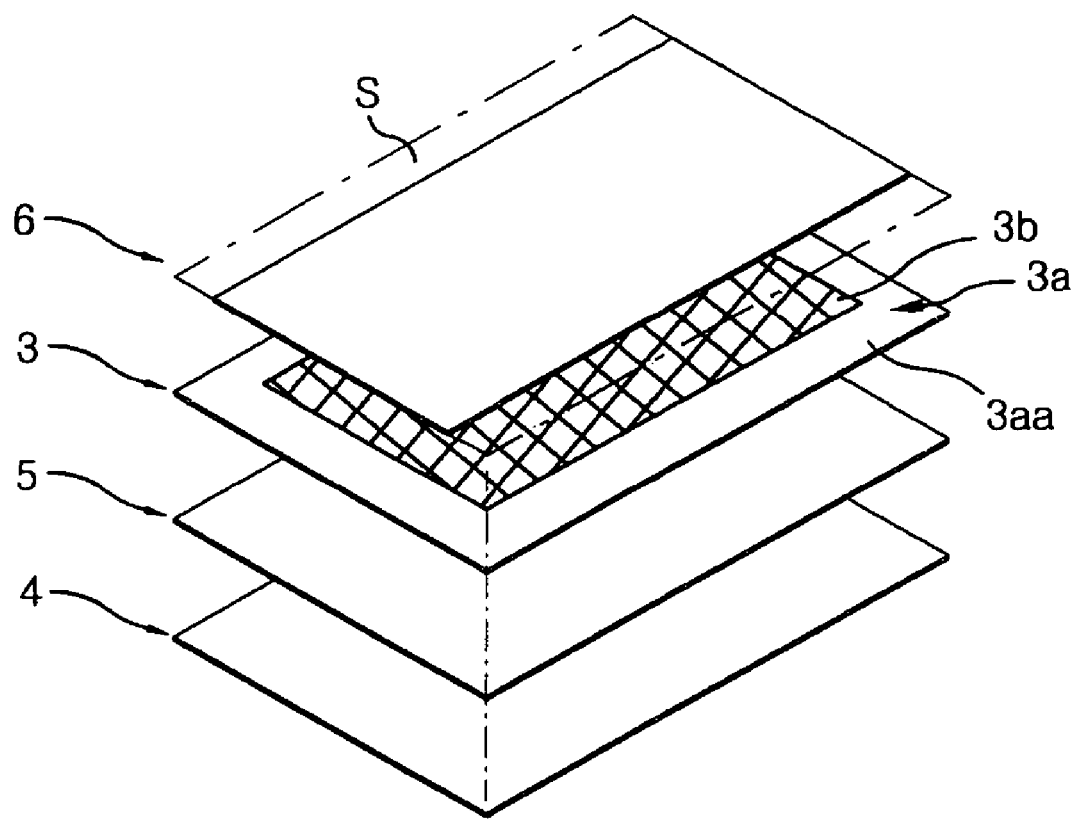
FIG. 17a is an exploded perspective view showing briefly an EMI film and a functional film, which are positioned with different sizes, of a film assembly according to a second embodiment of the present invention.
Figure 17B:
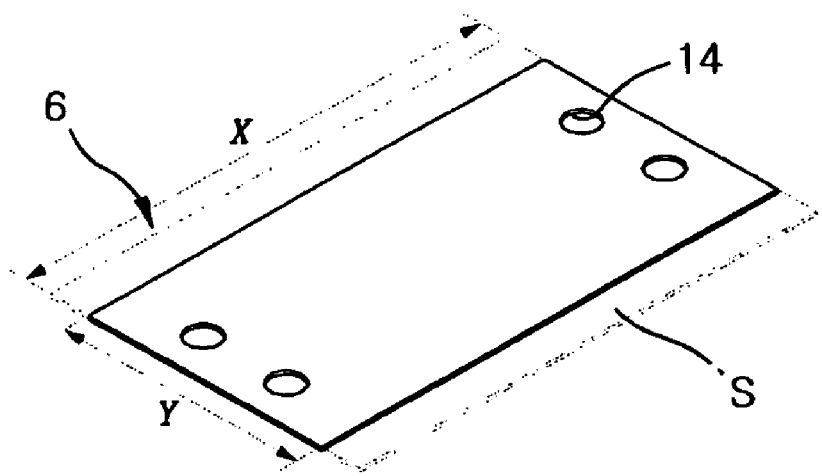
FIG. 17b is a perspective view showing briefly a functional film having through-holes formed along two edges thereof.
Figure 17C:
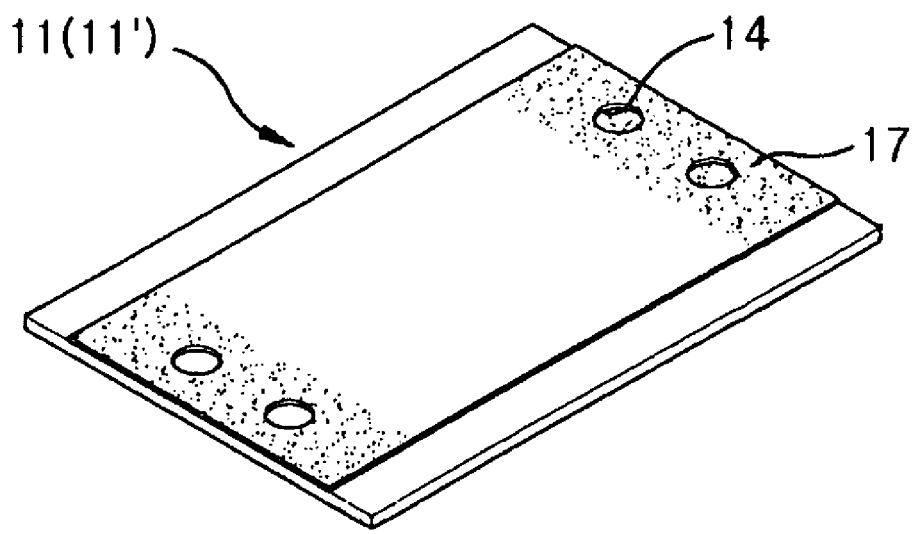
FIG. 17c is a perspective view showing briefly a film assembly including a functional film having through-holes formed thereon, a residual film integrated with the functional film, and a conductive layer formed on the corresponding portion of the films.
Figure 17D:
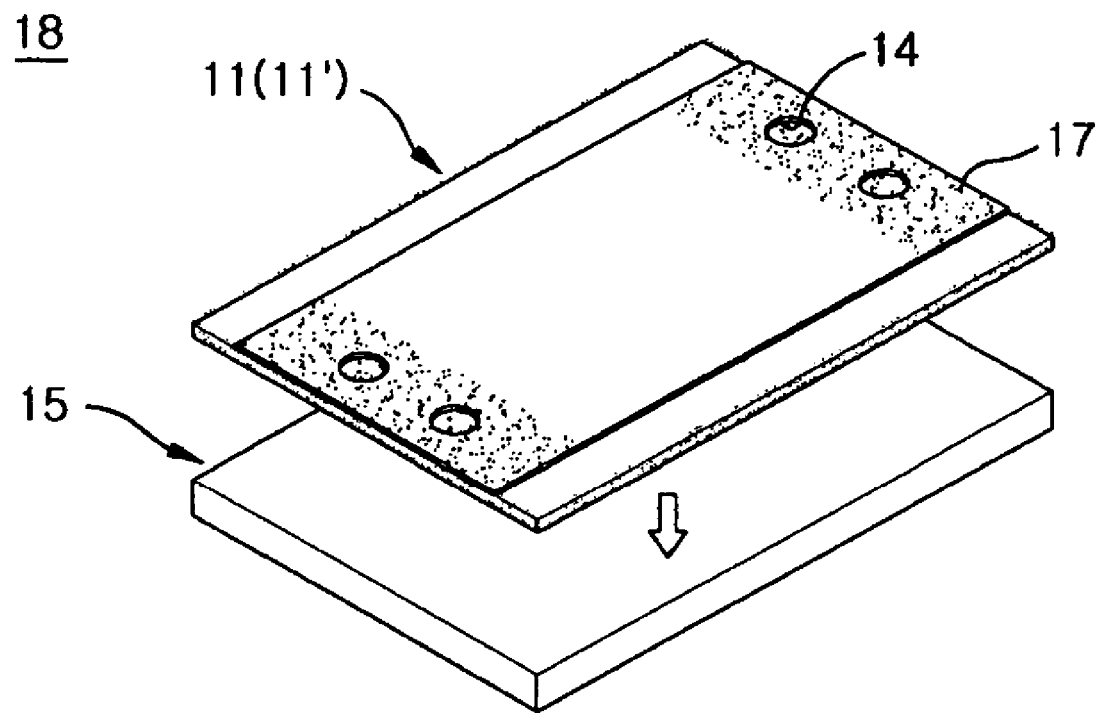
FIG. 17d is a perspective view showing briefly a film assembly, which is attached to a transparent substrate for a PDP filter, according to a second embodiment of the present invention.

If the functional film 4, 5, or 6 attached to the effective screen portion 3b of the EMI film 3 is cut into a square having the same length with the EMI film 3 but a smaller width than that of the EMI film, in the punching step (step 100), the through-holes 4 are preferably formed only on both short edges of the functional film 4, 5, or 6 (refer to FIGS. 17a and 17b).

In the bonding step (step 110), two kinds of films are generally used for lamination. If a number of film layers 11' are to be formed, the bonding step is repeated as many times as needed.

In the conductive material formation step, a printing mode, a spraying mode, or any other mode may be used. Preferably, the printing mode is used when the corresponding functional film 4, 5, or 6 has a small thickness and the through-holes 14 have a small depth, while the spraying mode is used when the corresponding functional film 4, 5, or 6 has a large thickness and the through-holes 14 have a large depth.

Each functional film may be any one of an NIR (near infrared) film 4, a color compensation film 5, an AR (anti-reflection) film 6, and any other film.

The film assembly 11 that has undergone the cutting step (step 130) is aligned with and attached to a transparent substrate 15 for a PDP manually or with an automatic assembly machine. The transparent substrate 15 having the film assembly 11 then can be conveniently attached to the corresponding surface of a PDP (refer to FIGS. 16d and 17d).

A film assembly for a PDP filter according to the present invention manufactured by the above-mentioned method will now be described with reference to FIGS. 11 to 17d.

Figure 11:
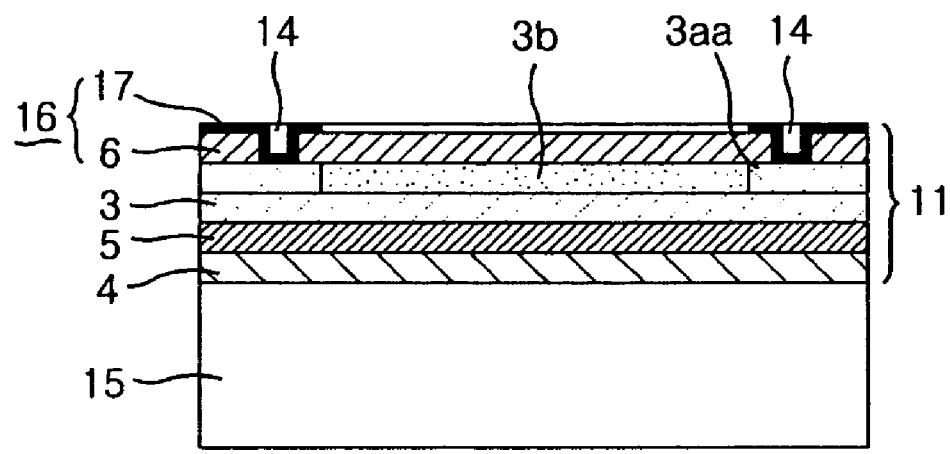
FIG. 11 is a sectional view showing briefly a PDP filter according to a first embodiment of the present invention.
Figure 15:
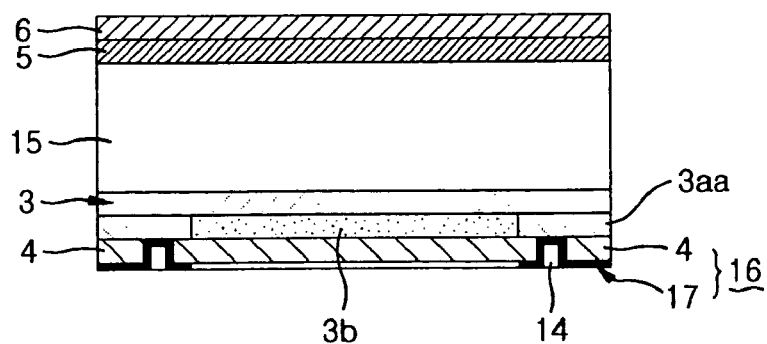
FIG. 15 is a sectional view showing briefly a PDP filter according to a second embodiment of the present invention.

A film assembly for a PDP filter according to the present invention includes an EMI film 3 having a conductive effective screen portion 3b formed on a surface thereof and a functional film 4, 5, or 6 attached to face the effective screen portion 3b of the EMI film and having at least partially has an electrical connection means 16 for electrical connection between ground portions 3aa formed on edges of the EMI film 3 and the corresponding surface (not shown) of a PDP (refer to FIGS. 11 and 15).

Figure 14:
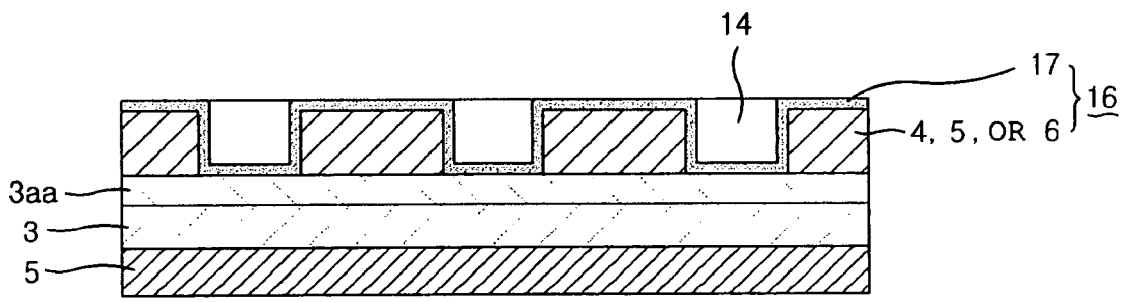
FIG. 14 is a magnified sectional view taken along line A-A of FIG. 13.

The electrical connection means 16 includes a functional film 4, 5, or 6 having a number of through-holes 14 formed on at least two edges thereof for electrical connection to the ground portions 3aa on the edges of the EMI film 3; and an electrical connection layer 17 formed around each through-hole 14 and on the corresponding portions of the ground portions 3aa for electrical connection between the ground portions 3aa on the edges of the EMI film 3 and the corresponding surface of the PDP via each through-hole 14 of the functional film (refer to FIGS. 11, 14, and 15).

The electrical connection means 16 may also be formed by melting a conductive material into a part of the corresponding film 4, 5, or 6 or by mixing a conductive inorganic material with the corresponding functional film, in addition to having the above-mentioned configuration.

The electrical connection layer 17 may be made up of various materials and is preferably made up of a silver layer when the resistance needs to be substantially reduced. The electrical connection layer 17 is preferably formed on the exterior of the corresponding functional film 4, 5, or 6 positioned on the outermost side of the PDP filter, in consideration of the arrangement structure (refer to FIGS. 11 and 15).

Figure 12:
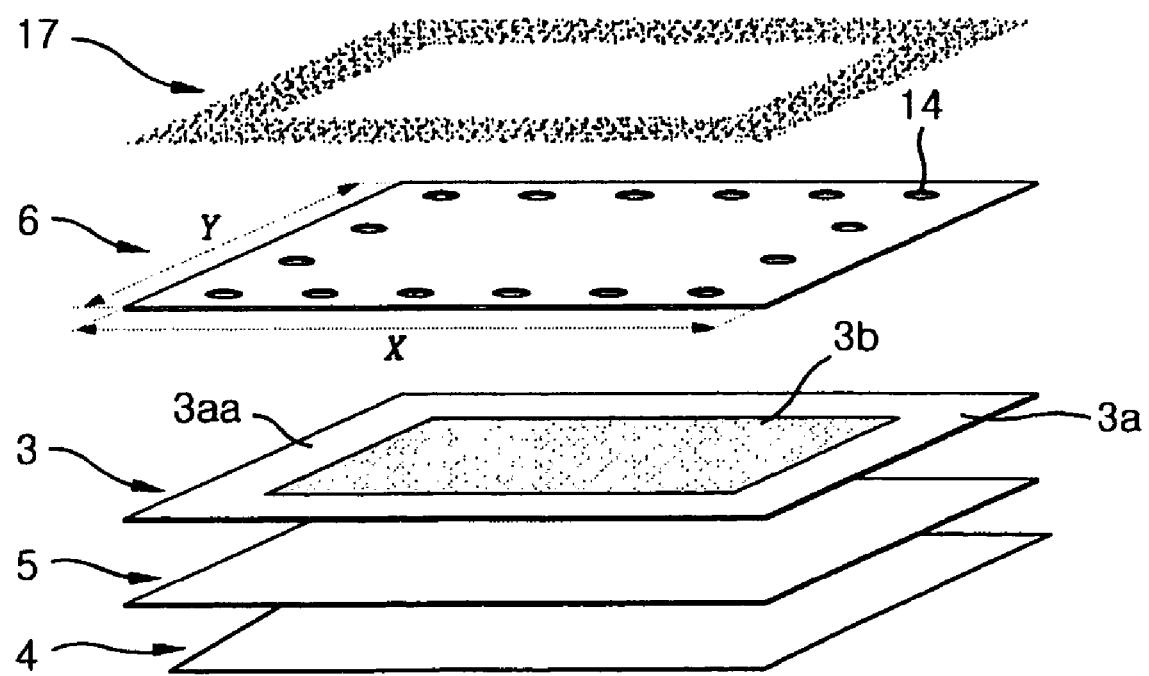
FIG. 12 is an exploded perspective view showing briefly a film assembly used in a PDP filter according to a first embodiment of the present invention.
Figure 13:
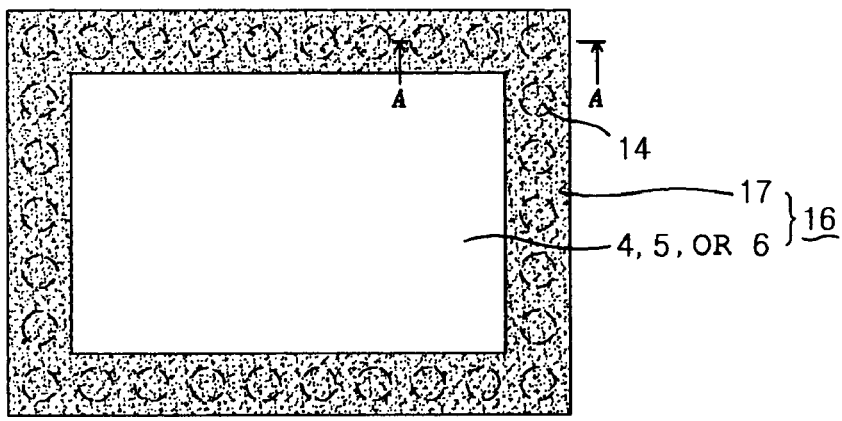
FIG. 13 is a top view showing briefly a film assembly used in a PDP filter according to a first embodiment of the present invention.

The through-holes 14 of the functional film 4, 5, or 6 may have the shape of a circle, an ellipse, a triangle, a square, or other various shapes and are preferably positioned with the same spacing between them (refer to FIGS. 12, 16b, and 17b).

A PDP filter according to the present invention will now be described with reference to FIGS. 11 to 17d.

A PDP filter according to the present invention has a film assembly 11, configured as mentioned above, attached to at least one of both surfaces of a transparent substrate 15 for a PDP filter 18. Another functional film, which is different from the functional film attached to face the conductive effective screen portion 3b of the EMI film 3, may be positioned between the transparent substrate 15 and the EMI film 3 and on a surface of the transparent substrate 15 opposite to the EMI film 3 (refer to FIGS. 11 and 15).

The functional film and the other functional film may be made up of at least one film chosen from a group including an NIR (near infrared) film 4, a color compensation film 5, an AR (anti-reflection) film 6, and any other film, respectively, and are preferably positioned in such a manner that they do not functionally overlap each other in consideration of the structure of the PDP filter.

The effective screen portion 3b of the EMI film 3 may be formed by an etching or deposition process.

FIG. 11 is a sectional view showing a PDP filter according to a first embodiment of the present invention. The PDP filter includes a transparent substrate 15 and a film assembly 11 (or film layer 11') made up of a number of functional films 3, 4, 5, and 6 attached to the transparent substrate to perform various functions. All of the functional films 3, 4, 5, and 6 of the film assembly 11 are integrated on a surface of the transparent substrate 15.

Among the multi-layered films constituting the film assembly 11, a functional film directly attached to the EMI film 3 while facing the conductive effective screen portion 3b of the EMI film 3 may be any one of an NIR (near infrared) film 4, a color compensation film 5, an AR (anti-reflection) film 6, and any other film. FIG. 11 shows an example of an AR film 6 attached to the EMI film 3 and FIG. 15 shows an example of an NIR film 4 attached to the EMI film 3.

The EMI film 3 and the functional film 4, 5, or 6 are electrically connected to each other via an electrical connection means 16 as mentioned above. The position of through-holes 14 of the functional film 4, 5, or 6, which is used to constitute the electrical connection means 16, may vary depending on the size of the functional film relative to the EMI film 3.

When the functional film 4, 5, or 6 facing the conductive effective screen portion 3b of the EMI film 3 has the same size with the EMI film 3 as shown in FIG. 12, the through-holes 14 of the functional film 4, 5, or 6 are preferably formed on all of the four edges thereof. Particularly, the through-holes 4 are formed on the four edges of the AR film 6 in the longitudinal and traverse directions X and Y.

When the edges in the longitudinal or traverse direction X or Y of the functional film 4, 5, or 6 facing the conductive effective screen portion 3b of the EMI film 3 has a smaller size than the corresponding portion of the EMI film 3 as shown in FIGS. 17a and 17b, the through-holes 14 are formed on the remaining edges except for the smaller portions S of the functional film 4, 5, or 6. A part of the ground portion 3aa of the EMI film 3 is exposed to the exterior by the smaller portions S of the functional film 4, 5, or 6 and can be directly grounded to the corresponding surface of the PDP.

FIG. 15 is a sectional view showing a PDP filter according to a second embodiment of the present invention. The PDP filter includes a transparent substrate 15, a color compensation film 5 attached to a surface of the transparent substrate 15, an AR film 6 attached to the outer surface of the color compensation film 5, an EMI film 3 attached to the other surface of the transparent film 15, and an NIR (near infrared) film 4 attached to the outer surface of the EMI film 3.

In the embodiment shown in FIG. 15, the functional films 3, 4, 5, and 6 constituting the film assembly 11 are partially divided and separately attached to both surfaces of the transparent substrate 15, in contrast to the embodiment shown in FIG. 11.

Due to this difference, edges of the NIR film 4 facing the conductive effective screen portion 3b of the EMI film 3 have a number of through-holes 14 formed thereon, which is used to constitute an electrical connection means 16 to electrically connect the ground portion 3aa of the EMI film 3 to the corresponding surface of the PDP.

An electrical connection layer 17 is formed around each through-hole 14 of the NIR film 4 and on the outer edges of the NIR film 4. The electrical connection layer 17 is preferably made up of conductive paint including silver particles having excellent conductivity.

The EMI film 3 is manufactured by an etching or deposition process. When an etching process is used, the EMI film is formed by laminating a copper foil film with a thickness of about 10 μm on a PET film and by forming a mesh pattern by an etching process. When a deposition process is used, the EMI film is formed by repeatedly depositing an ITO and a silver layer on a PET film with a unit of tens of nm and by radiating visual rays to reduce the surface resistance.

Experiment has been performed to measure electromagnetic waves when a film assembly manufactured in the conventional mode and a film assembly manufactured in a roll-to-roll mode according to the present invention are used in PDP modules. The result is given in graphs shown in FIGS. 18a to 18f.

Figure 18A:
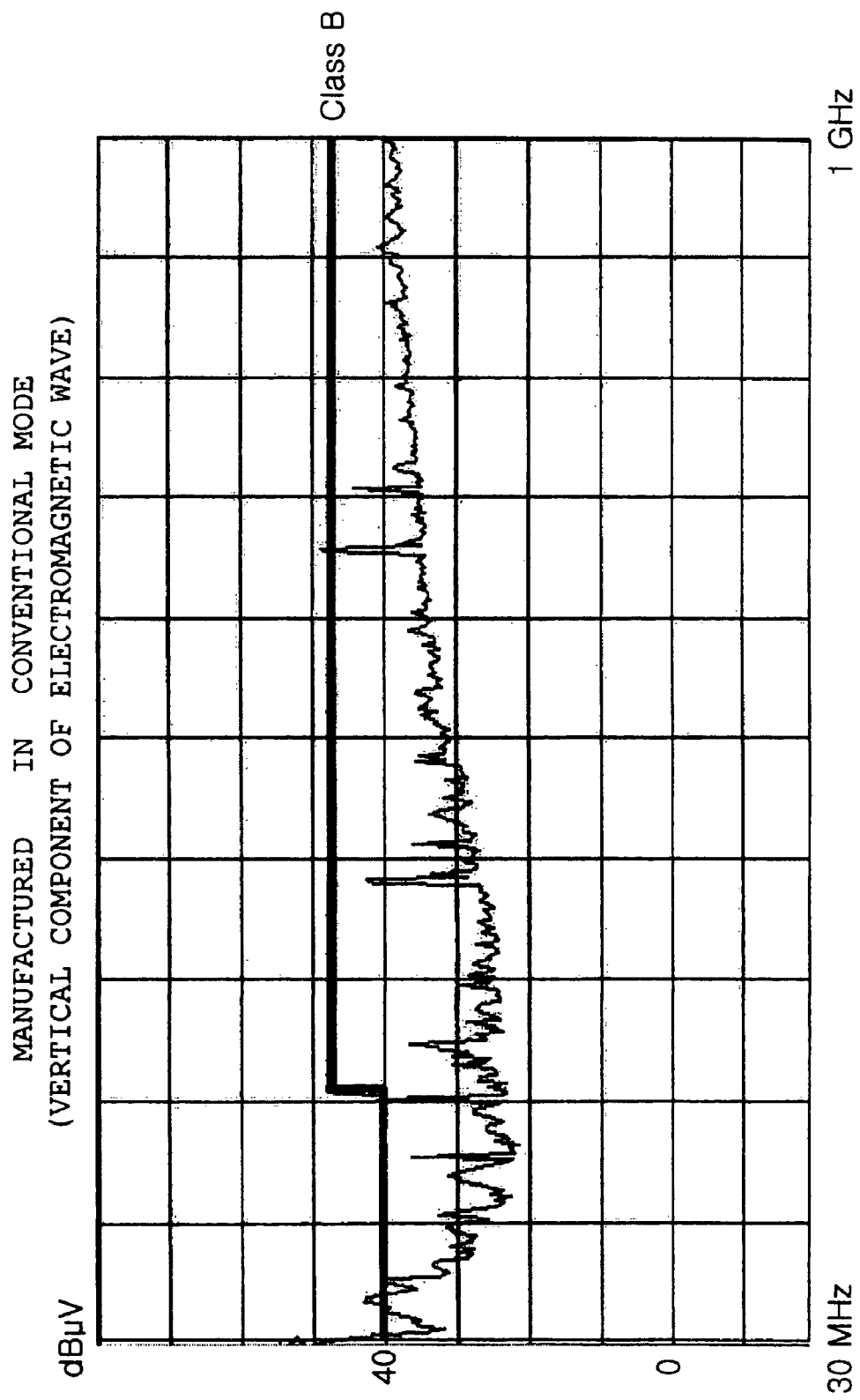
FIG. 18a is a graph showing the vertical component of an electromagnetic wave measured when a film assembly manufactured in a conventional mode, as shown in FIG. 3, is used in a PDP module.
Figure 18B:
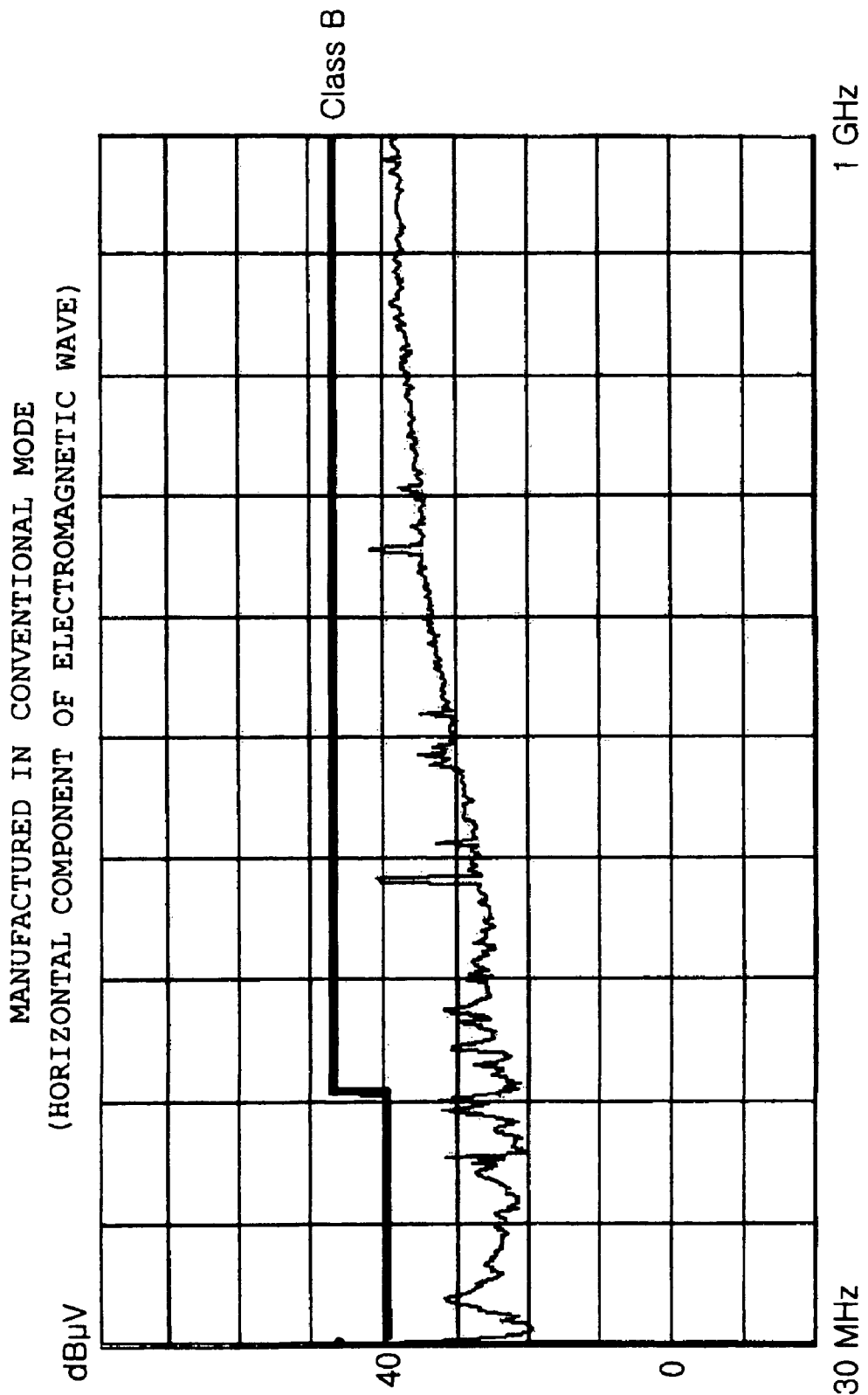
FIG. 18b is a graph showing the horizontal component of an electromagnetic wave measured when a film assembly manufactured in a conventional mode, as shown in FIG. 3, is used in a PDP module.
Figure 18C:
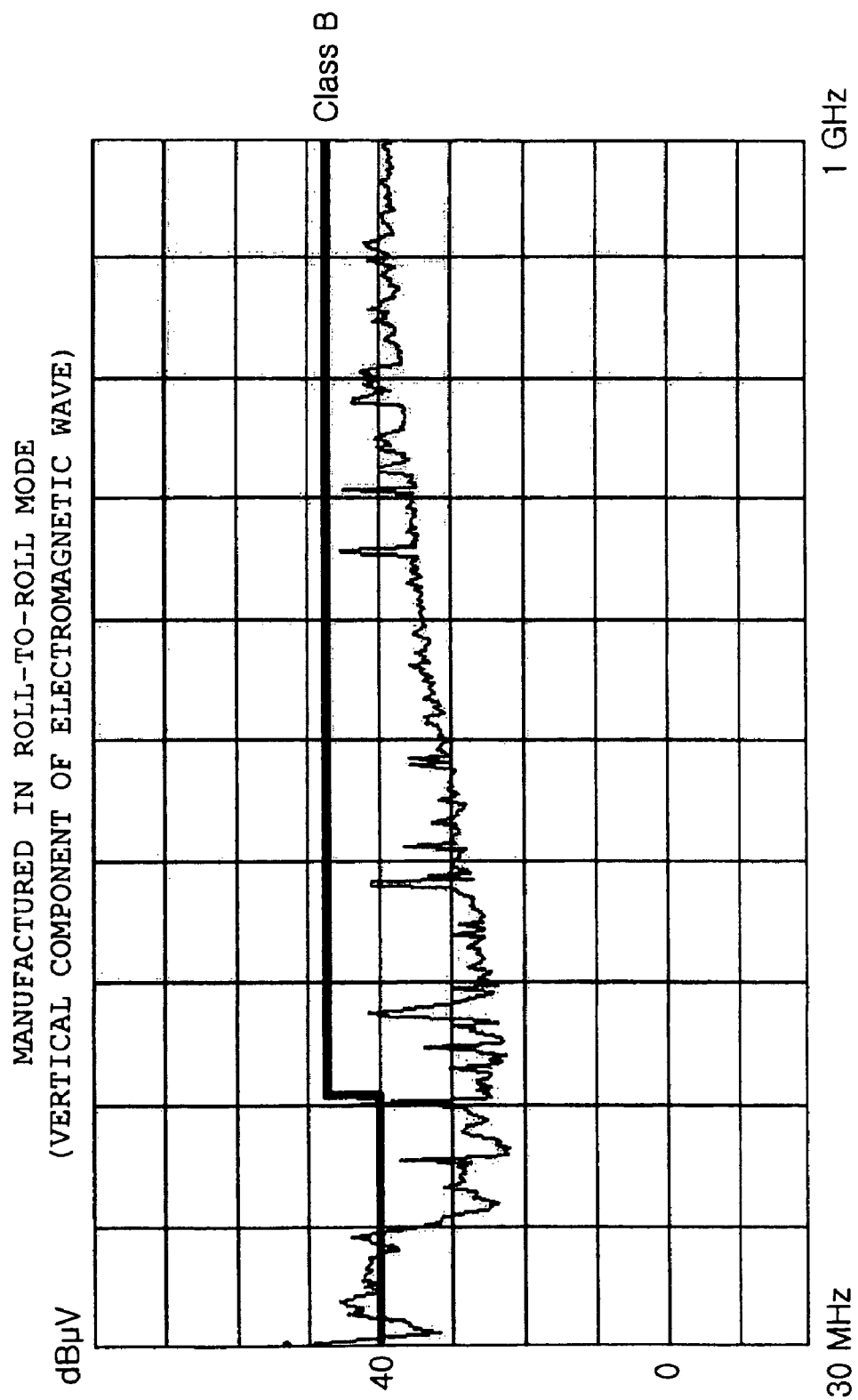
FIG. 18c is a graph showing the vertical component of an electromagnetic wave measured when a film assembly manufactured in a roll-to-roll mode according to the present invention, as shown in the left view of FIG. 8, is used in a PDP module.
Figure 18D:
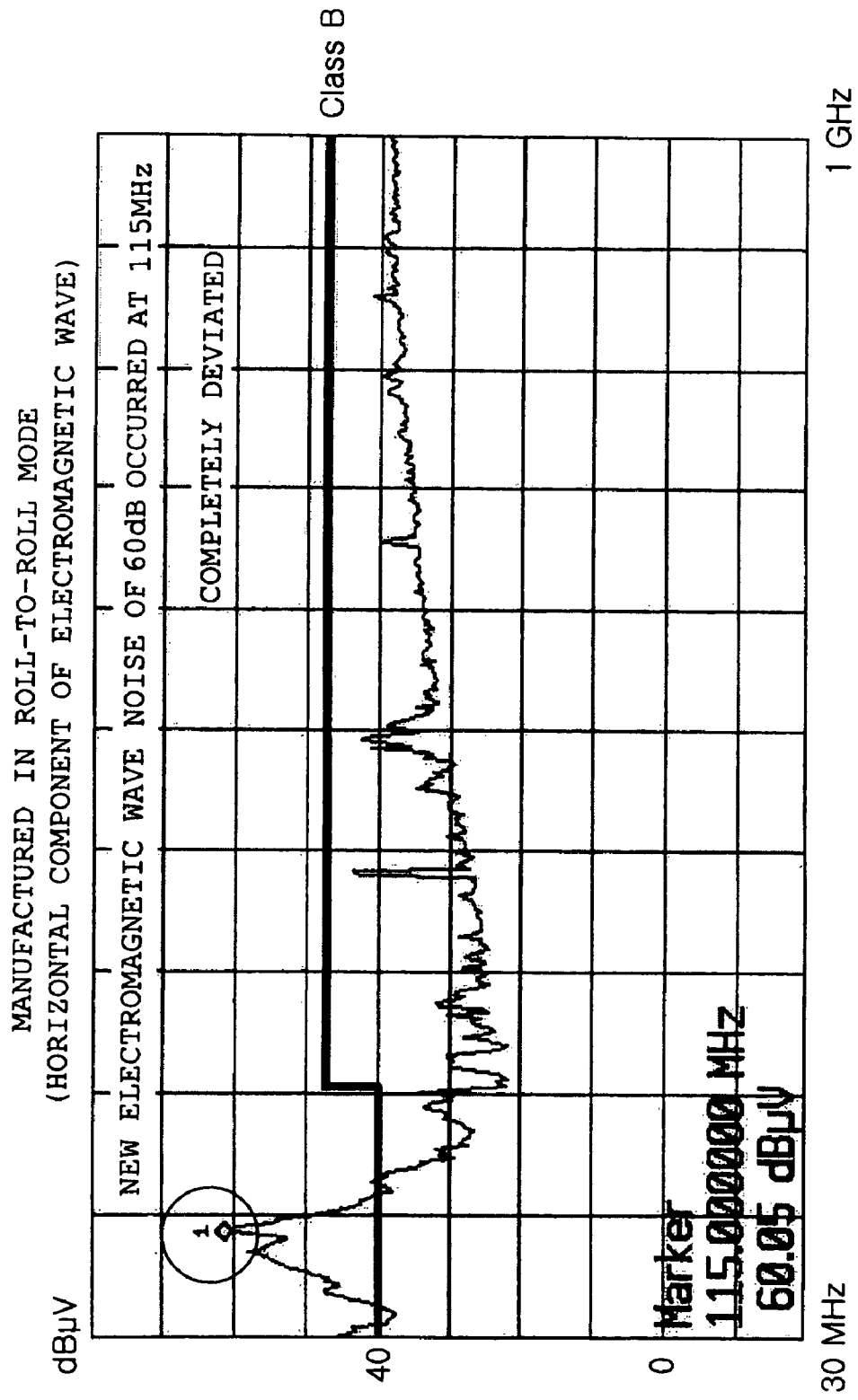
FIG. 18d is a graph showing the horizontal component of an electromagnetic wave measured when a film assembly as shown in the left view of FIG. 8 is used in a PDP module.
Figure 18E:
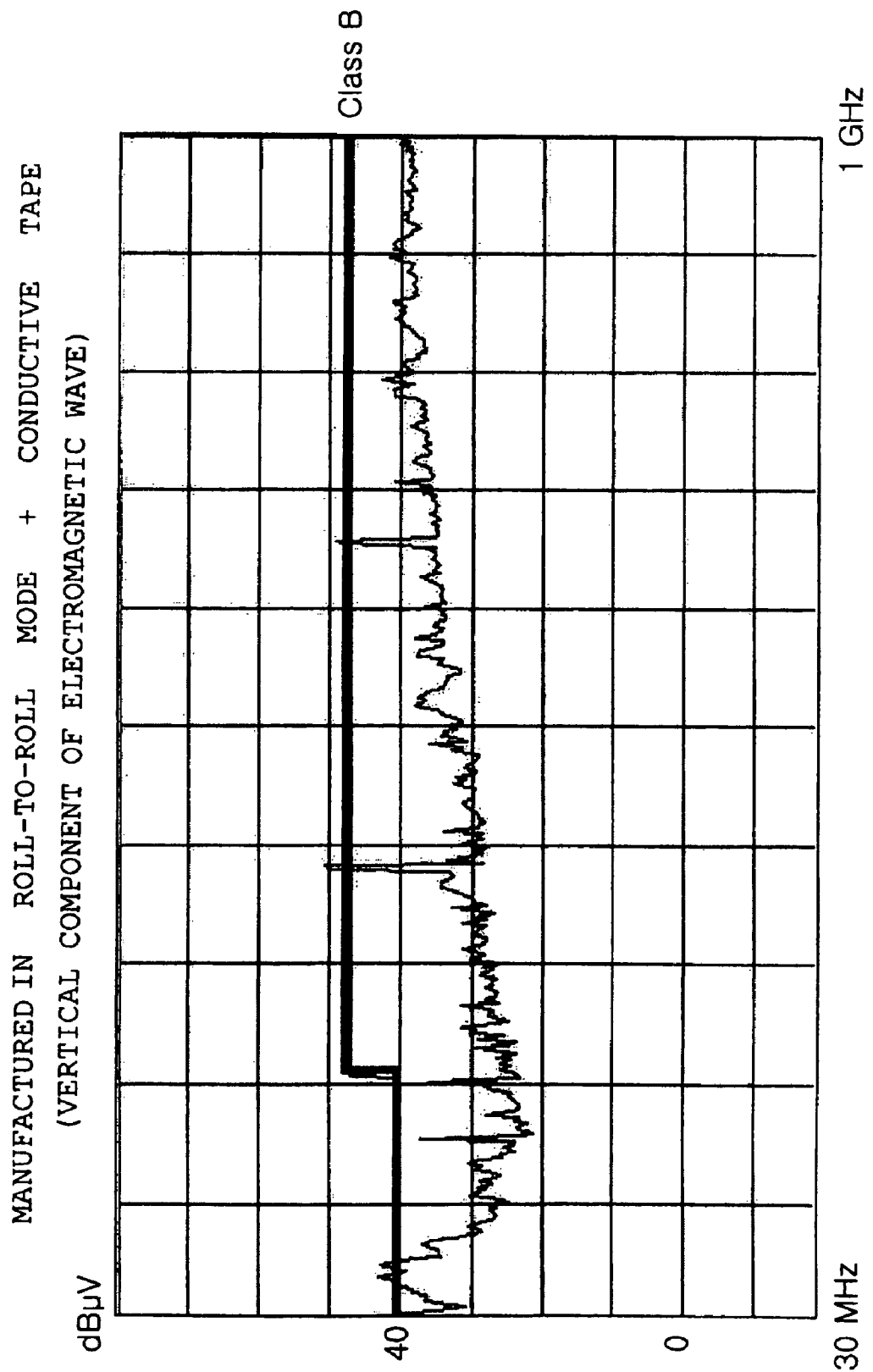
FIG. 18e is a graph showing the vertical component of an electromagnetic wave measured when a film assembly manufactured in a roll-to-roll mode according to the present invention, as shown in the right view of FIG. 8, is used in a PDP module.
Figure 18F:
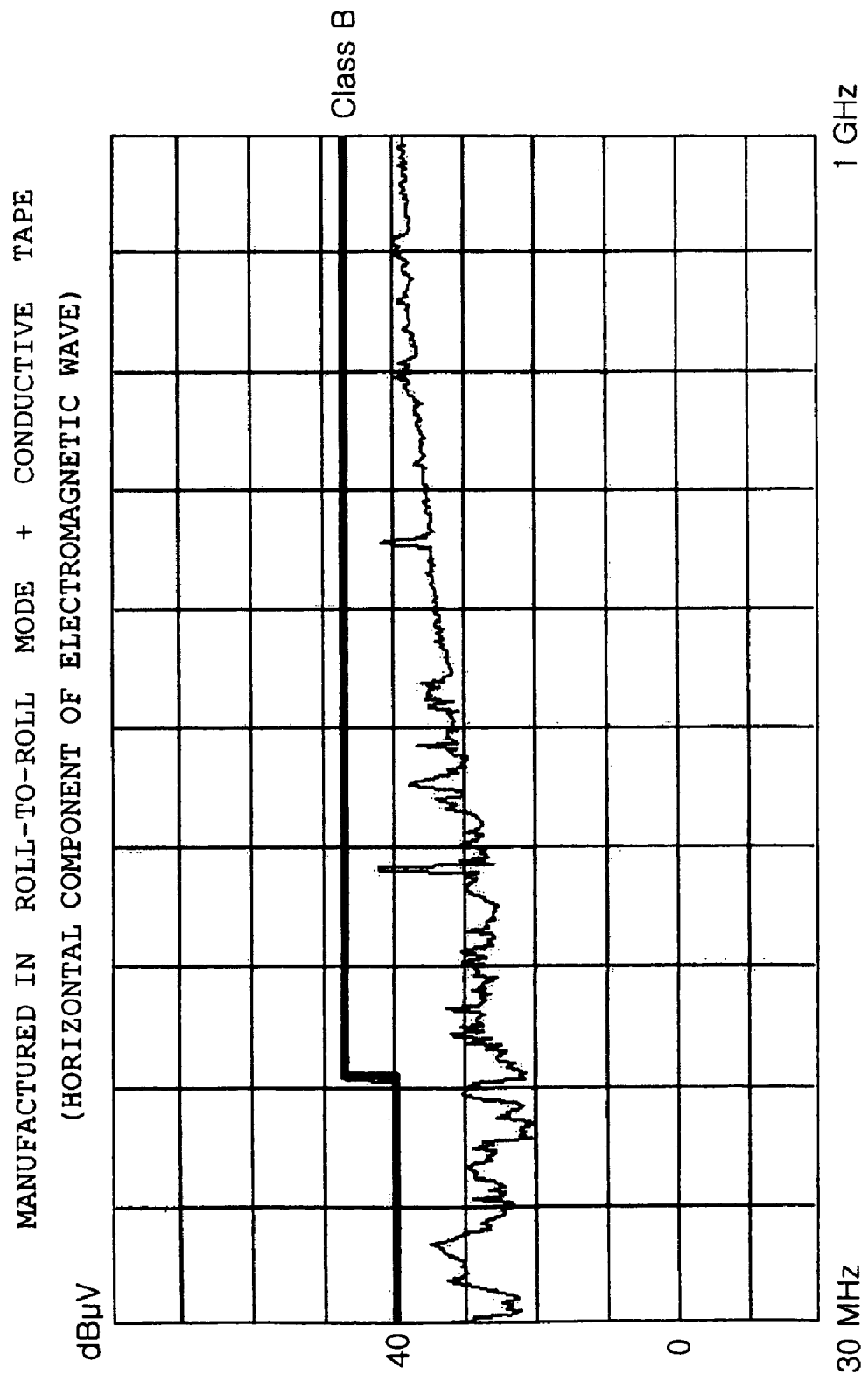
FIG. 18f is a graph showing the horizontal component of an electromagnetic wave measured when a film assembly as shown in the right view of FIG. 8 is used in a PDP module.

It has been confirmed that the film assembly manufactured in a roll-to-roll mode according to the present invention can be manufactured in large amounts and has an excellent electromagnetic wave interruption effect as shown in FIGS. 18e and 18f, as that of the film assembly manufactured in the conventional mode (refer to FIGS. 18a and 18b).

INDUSTRIAL APPLICABILITY

As can be seen from the foregoing, according to the present invention, it is possible to largely manufacture a film assembly including an EMI film having an effective screen portion formed on a transparent polymer resin film and a functional film attached to the effective screen portion of the EMI film in a roll-to-roll mode.

It is possible to secure an enough ground region of the film assembly manufactured in the roll-to-roll mode.

It is possible to secure an enough ground region between the ground portion of the EMI film constituting the film assembly and the corresponding surface of a PDP.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. A film assembly for a PDP filter comprising:
an EMI film having a conductive effective screen portion formed on a surface of a transparent polymer resin film;
at least one functional film attached to face the conductive effective screen portion and having the same length as the EMI film and a width to at least partially cover the conductive effective screen portion on the EMI film; and
conductive members having a middle part thereof positioned on a surface of both short edges of left and right sides of the function film, respectively, and having both ends thereof positioned on corresponding corner parts of both short edges of the left and right sides of the EMI film, respectively, to secure a ground region for the EMI film.

2. The film assembly for a PDP filter according to claim 1, wherein the conductive members are additionally positioned on both long edges of the EMI film, respectively, to secure a ground region for the EMI film when the functional film covers at least a half of both long edges of the EMI film.

3. The film assembly for a PDP filter according to claim 1, wherein the conductive members are any one of conductive tapes and conductive paste.

4. The film assembly for a PDP filter according to claim 3, wherein the conductive paste is made up of any one chosen from a group comprising gold, silver, copper, and graphite.

5. The film assembly for a PDP filter according to claim 1, wherein the effective screen portion of the EMI film is made up of at least one component chosen from a group comprising gold, silver, copper, nickel, and aluminum.

6. The film assembly for a PDP filter according to claim 1, wherein the functional film is chosen from a group comprising an NIR (near infrared) film, a color compensation film, and an AR (anti-reflection) film.

7. A PDP filter with a film assembly according to claim 1 attached to at least one of both surfaces of a transparent substrate.

8. The PDP filter according to claim 7, further comprising another functional film, which is different from the functional film attached to face the conductive effective screen portion of the EMI film, positioned between the EMI film of the film assembly and the transparent substrate and on a surface of the transparent substrate opposite to the EMI film.

9. The PDP filter according to claim 8, wherein the functional film and the other functional film are made up of at least one film chosen from a group comprising an NIR (near infrared) film, a color compensation film, and an AR (anti-reflection) film, respectively, and are positioned in such a manner that they do not functionally overlap each other.

10. The PDP filter according to claim 8, wherein the effective screen portion of the EMI film is formed by an etching or deposition process.

* * * * *